(12) United States Patent
Lee et al.

(10) Patent No.: US 12,364,130 B2
(45) Date of Patent: Jul. 15, 2025

(54) DISPLAY DEVICE

(71) Applicant: LG DISPLAY CO., LTD., Seoul (KR)

(72) Inventors: Seongku Lee, Paju-si (KR); Binn Kim, Paju-si (KR)

(73) Assignee: LG Display Co., Ltd. (KR)

( * ) Notice: Subject to any disclaimer, the term of this patent is extended or adjusted under 35 U.S.C. 154(b) by 789 days.

(21) Appl. No.: 17/549,330

(22) Filed: Dec. 13, 2021

(65) Prior Publication Data

US 2022/0208882 A1 Jun. 30, 2022

(30) Foreign Application Priority Data

Dec. 31, 2020 (KR) .......................... 10-2020-0189300

(51) Int. Cl.
| | |
|---|---|
| *H10K 59/35* | (2023.01) |
| *G09F 9/302* | (2006.01) |
| *G09G 3/20* | (2006.01) |
| *H10K 59/65* | (2023.01) |

(52) U.S. Cl.
CPC ........... *H10K 59/351* (2023.02); *G09F 9/302* (2013.01); *G09G 3/2003* (2013.01); *H10K 59/353* (2023.02); *H10K 59/65* (2023.02)

(58) Field of Classification Search
CPC . H01L 27/3227; H01L 27/3234; H10K 59/60; H10K 59/65; H10K 59/121; H10K 59/353; G09G 2300/0465
See application file for complete search history.

(56) References Cited

U.S. PATENT DOCUMENTS

| | | | | |
|---|---|---|---|---|
| 9,312,312 | B1* | 4/2016 | Tsai | ..................... H10K 59/121 |
| 11,567,311 | B1* | 1/2023 | Qiao | ..................... G02B 26/023 |
| 2022/0392963 | A1* | 12/2022 | Chen | .................. H10K 59/8792 |

FOREIGN PATENT DOCUMENTS

| | | |
|---|---|---|
| KR | 2014-0101605 A | 8/2014 |
| KR | 20140120819 A | 10/2014 |
| KR | 20150045327 A | 4/2015 |
| KR | 2016-0145718 A | 12/2016 |
| KR | 20200044245 A | 4/2020 |

OTHER PUBLICATIONS

Office Action in Korean Appln. No. 20200189300, mailed on Dec. 17, 2024, 17 pages (with English translation).

* cited by examiner

*Primary Examiner* — Yuzhen Shen

(74) *Attorney, Agent, or Firm* — Fish & Richardson P.C.

(57) ABSTRACT

A display device includes unit pixels arranged in a row direction and a column direction and each of which includes a plurality of sub-pixels, and the display device includes transmissive areas disposed adjacent to the unit pixels and through which external light passes, wherein each of the unit pixels has a shape according to any one of a first pattern to a fourth pattern, and the unit pixels adjacent in the row direction and the column direction have different patterns from each other.

24 Claims, 11 Drawing Sheets

DISPLAY DEVICE

CROSS-REFERENCE TO RELATED APPLICATION

The present application claims the priority of Korean Patent Application No. 10-2020-0189300, filed Dec. 31, 2020, which is hereby incorporated by reference in its entirety for all purposes.

BACKGROUND

Field of the Disclosure

The present disclosure relates to a display device.

Description of the Background

An organic light-emitting element (hereinafter, referral to as a light-emitting element) constituting an organic light-emitting display device is self-luminous and does not require a separate light source, so that a thickness and a weight of a display device can be reduced. In addition, the organic light-emitting display device has high quality characteristics, such as low power consumption, high luminance, and a high response rate.

In general, a light-emitting element has a structure in which the following are stacked: an anode electrode, a bank surrounding an edge area of the anode electrode, an emission layer formed on the anode electrode at an inside of the bank, and a cathode electrode covering the emission layer and the bank. The amount of current flowing to the light-emitting element is controlled by a driving transistor, so that the light-emitting element emits light at a required luminance.

The organic light-emitting display device may be configured as a transparent display device by making a transistor or a light-emitting element inside the organic light-emitting display device to be in transparent form, or by separating a circuit area and a transmissive area from each other.

SUMMARY

Accordingly, the present disclosure is to provide a display device in which unit pixels having different patterns are arranged in a row direction and in a column direction, thereby increasing an area of a transmissive area.

According to an aspect of the present disclosure, a display device includes unit pixels arranged in a row direction and a column direction, and each of which includes a plurality of sub-pixels; and transmissive areas disposed adjacent to the unit pixels, and through which external light passes, wherein each of the unit pixels may have a shape according to any one of a first pattern to a fourth pattern, and the unit pixels adjacent in the row direction and the column direction may have different patterns from each other.

The sub-pixels may include a red color sub-pixel, a green color sub-pixel, a blue color sub-pixel, and a white color sub-pixel.

Each of the first to fourth patterns may include: a first extension part extending in the column direction; and a second extension part extending in the row direction from a first end or a first side of the first extension part.

The unit pixels in two patterns among the first to the fourth patterns may be alternately disposed along the row direction and the column direction.

When a first unit pixel has the first pattern, a second unit pixel disposed adjacent to the first unit pixel in the column direction may have the second pattern, and a third unit pixel disposed adjacent to the first unit pixel in the row direction may have the third pattern, and a fourth unit pixel disposed adjacent to the third unit pixel in the column direction may have the fourth pattern.

The sub-pixels may be disposed in the first to the fourth patterns, and may be disposed so that the sub-pixels of the same color are not to be in contact with each other between the unit pixels adjacent in the row direction and the column direction.

The first pattern may include a first extension part and a second extension part extending from an upper end of the first extension part to a first side along the row direction, the second pattern may include a first extension part and a second extension part extending from an upper end of the first extension part to a second side along the row direction, the third pattern may include a first extension part and a second extension part extending from a lower end of the first extension part to the first side, and the fourth pattern may include a first extension part and a second extension part extending from a lower end of the first extension part to the second side.

In the unit pixels, the first extension parts of the unit pixels may be disposed in a row along the column direction, the second extension parts of a pair of the unit pixels disposed adjacent to each other in the column direction may be disposed to extend in different side directions from each other, and the second extension parts of the unit pixels may be disposed in a zigzag manner along the row direction.

Sub-pixels having different colors from each other may be sequentially arranged on the first extension parts that are disposed in a row along the column direction, and sub-pixels having different colors from each other may be arranged in a matrix form on the second extension parts that are disposed adjacent to each other in the column direction.

The transmissive areas may be defined as an area surrounded by four unit pixels having different patterns from each other and disposed adjacent to each other in the row direction and the column direction.

The transmissive areas may be arranged in the zigzag manner along the row direction.

Each of the first pattern and the fourth pattern may include a first extension part and a second extension part extending from an upper end of the first extension part to a first side along the row direction, and each of the second pattern and the third pattern may include a first extension part and a second extension part extending from a lower end of the first extension part to the first side along the row direction.

In the unit pixels, the first extension parts of the unit pixels may be disposed in a row along the column direction, and the second extension parts of a pair of the unit pixels disposed adjacent to each other in the column direction may be disposed to extend in the same side directions from each other.

Each of the first pattern and the fourth pattern may include a first extension part and a second extension part extending from a lower end of the first extension part to a first side along the row direction, and each of the second pattern and the third pattern may include a first extension part and a second extension part extending from a lower end of the first extension part to a second side along the row direction.

In the unit pixels, the second extension parts of the unit pixels may be disposed in a row along the row direction, the first extension parts of the unit pixels may be disposed in a zigzag manner along the column direction, and the second extension parts of a pair of the unit pixels disposed adjacent to each other in the column direction may be disposed to extend in different side directions from each other.

Sub-pixels having different colors from each other may be sequentially arranged on the second extension parts that are disposed in a row along the row direction, and sub-pixels having different colors from each other may be arranged in a matrix form on the first extension parts that are disposed adjacent to each other in the row direction.

The transmissive areas may be arranged in the zigzag manner along the column direction.

Each of the first pattern and the fourth pattern may include a first extension part and a second extension part extending from a first side surface of the first extension part to a first side along the row direction, and each of the second pattern and the third pattern may include a first extension part and a second extension part extending from a second side surface of the first extension part to a second side along the row direction.

In the unit pixels, the first extension parts of the unit pixels may be disposed in a row along the column direction, the second extension parts of the unit pixels may be disposed in a row along the row direction, and the second extension parts of a pair of the unit pixels disposed adjacent to each other in the column direction may be disposed to extend in different side directions from each other.

The transmissive areas may be defined as an area surrounded by six unit pixels disposed adjacent to each other in the row direction and the column direction.

The display device may include a camera disposed on a first side of the display device and a display panel on which the unit pixels and the transmissive areas are disposed.

The camera may be disposed to overlap with the transmissive areas and at least one light-emitting portion among light-emitting portions of the sub-pixels.

In the display device according to aspects of the present disclosure, the area of the transmissive area in the unit pixel is maximized, and a distance between the sub-pixels having the same colors positioned between the unit pixels adjacent to each other is maximized. Accordingly, a transmittance of the display device may be increased, and a clarity of an image and a text readability may be increased.

In addition, in the display device according to aspects of the present disclosure, the light-emitting portions of the sub-pixels in the unit pixels are distributedly disposed in an L type or a T type, so that an image recognition rate on the opposite side of the display device with respect to the camera may be improved.

BRIEF DESCRIPTION OF THE DRAWINGS

The above and other features and advantages of the present disclosure will be more clearly understood from the following detailed description when taken in conjunction with the accompanying drawings, in which.

DETAILED DESCRIPTION

Figure 1:
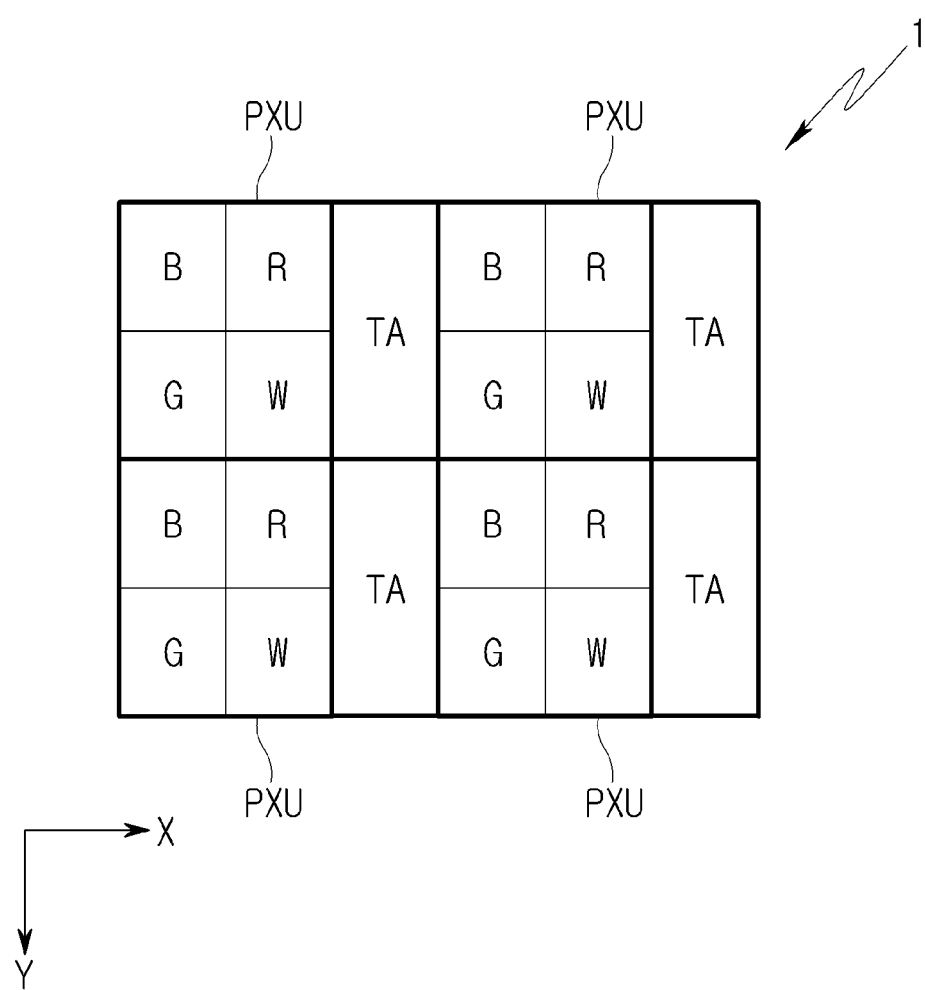
FIG. 1 is a plan view illustrating a display device according to the present disclosure.

Hereinafter, aspects of the present disclosure will be described in detail with reference to the accompanying drawings. In this specification, it will be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the drawings, the thickness, ratio, and dimensions of components are exaggerated for clarity of illustration. The term "and/or" includes one or more combinations that the associated elements may define.

It will be understood that although the terms such as "first" and "second" are used herein to describe various elements, these elements should not be limited by these terms. The terms are only used to distinguish one component from other components. For example, a first element referred to as a first element in one aspect can be referred to as a second element in another aspect without departing from the scope of the appended claims. The terms of a singular form may include plural forms unless referred to the contrary.

Also, ""under", "below", "above", "upper", and the like are used for explaining a relation association of components illustrated in the drawings. These terms are relative concepts and are described on the basis of the direction in the drawings.

The meaning of the term "include" or "comprise" specifies a property, a fixed number, a step, an operation, an element, a component or a combination thereof, but does not exclude other properties, fixed numbers, steps, operations, elements, components or combinations thereof.

FIG. 1 is a plan view illustrating a display device according to the present disclosure.

Referring to FIG. 1, a display device 1 according to the present disclosure may include unit pixels PXUs. The unit pixels PXUs are aligned along a row direction X and a column direction Y on the display panel, and may be arranged in a matrix form.

Each unit pixel PXU may include a plurality of sub-pixels R, G, B, and W. Each sub-pixel R, G, B, and W may include circuit elements for driving the sub-pixels R, G, B, and W, and a light-emitting element emitting light with luminance corresponding to a driving current controlled by the circuit elements. An area configured such that the light-emitting element emits light within each unit pixel PXU may be defined as a light-emitting portion. In an aspect illustrated in drawings, components denoted with unit pixel PXU may be substantially the same as the light-emitting portion or may include the light-emitting portion.

The sub-pixels R, G, B, and W may display one of a first to a fourth colors. For example, each sub-pixel R, G, B, and W may display one of red, green, blue, and white colors. Four sub-pixels R, G, B, and W that display different colors from one another may form one unit pixel PXU.

The display device 1 includes transmissive areas TAs that are disposed adjacent to each unit pixel PXU in the row direction X. On the transmissive area TA, a substrate or a thin-film transparent material is disposed, and an opaque conductive layer is not disposed. Therefore, the transmissive area TA passes external light therethrough. The unit pixels PXUs and the transmissive areas TAs may be disposed in a continuous manner without a physical discontinuation.

In FIG. 1, the unit pixels PXUs and the transmissive areas TAs are alternately disposed in the row direction X. In addition, the unit pixels PXUs and the transmissive areas TAs are each disposed along the column direction Y.

Figure 2A:
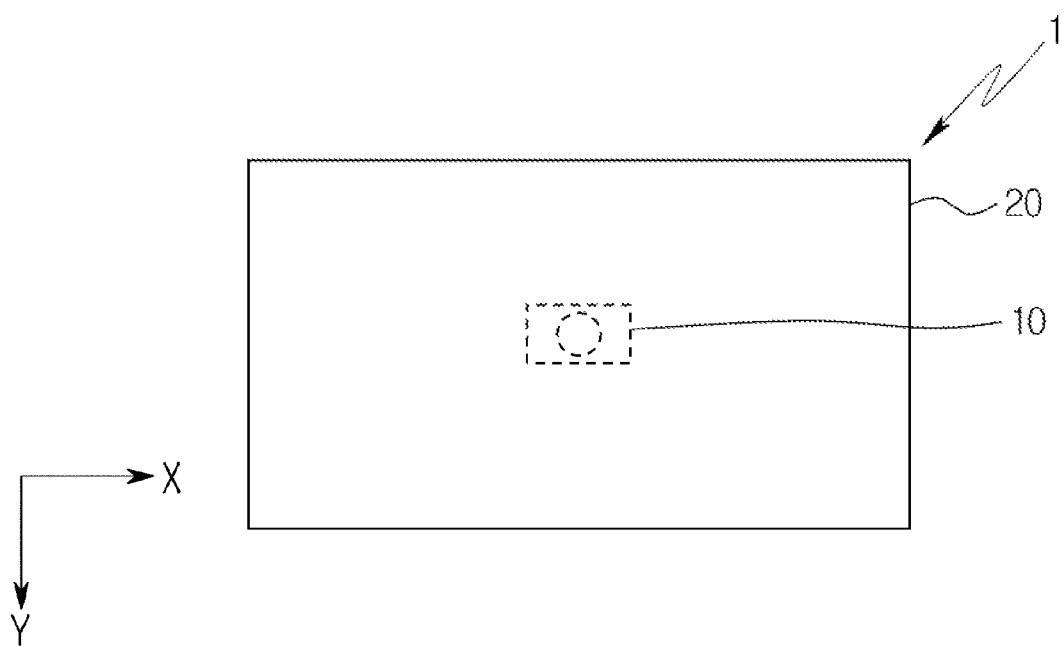
FIGS. 2A and 2B are views illustrating a configuration of the display device according to the present disclosure.
Figure 2B:
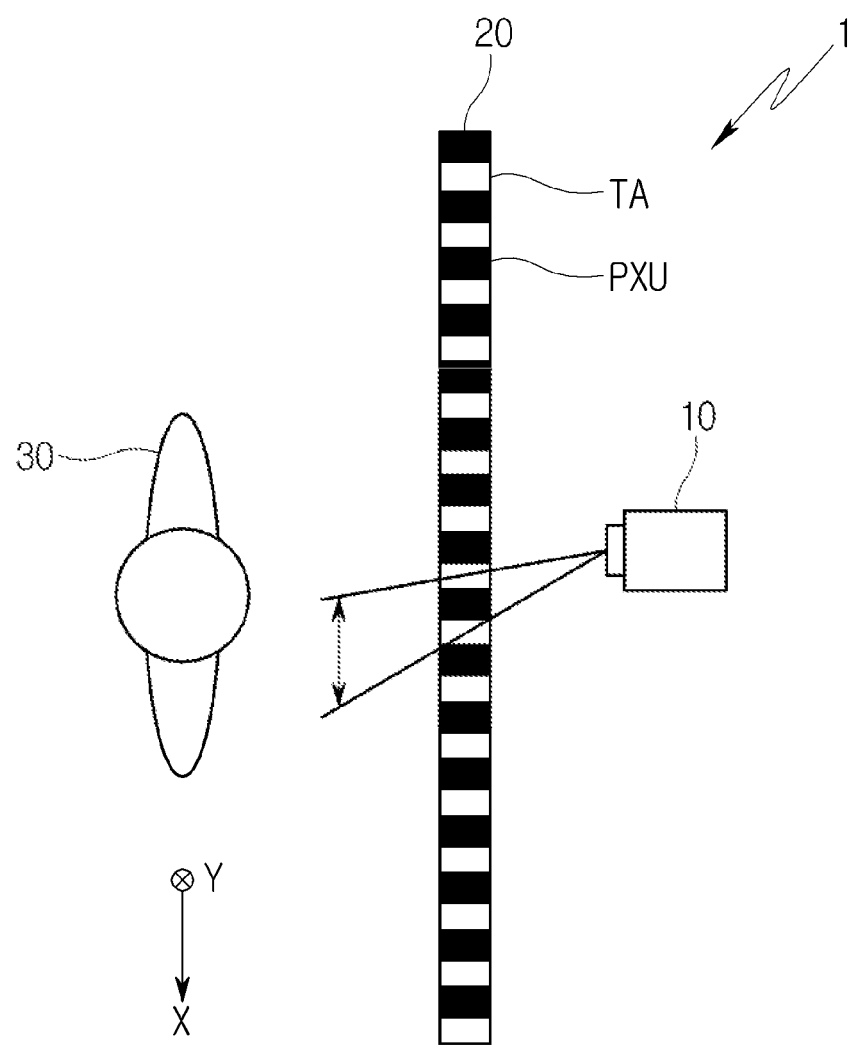

FIGS. 2A and 2B are views illustrating a configuration of the display device according to the present disclosure.

Referring to FIGS. 2A and 2B, the display device 1 may include a display panel (substrate) 20 described with reference to FIG. 1, and may include at least one camera system 10 disposed at a first side of the display panel 20. The camera system 10 may photograph an object such as a user 30 positioned on the opposite side of the display device 1 through the plurality of transmissive areas TA of the display panel 20.

Such a camera system may be used for a video conference between the user 30 who is remotely located. During the conference, when the user 30 is watching the information displayed on the display panel 20, (for example, an image of the other user, etc.) the camera system 10 positioned on the opposite side of the display panel 20 may photograph the user 30 through the transmissive areas TA and transmit an image to the other user's display device. The transmitted image may be displayed on the other user's display device. The user 30 may watch the other user through the display device 1, and at the same time a face of the user 30 may be displayed on the other's display panel, so that both users 30 can conduct the video conference as if they were talking face to face.

The display panel 20 of the display device 1 may include the unit pixels PXUs and the transmissive areas TAs that are aligned along the column direction Y as described with reference to FIG. 1. In this aspect, the camera system 10 cannot acquire an image of the user 30 in an area on which the unit pixels PXUs are disposed. When the unit pixels PXUs are disposed continuously along the column direction Y, the image of the user 30 not acquired appears in a vertical line form. Therefore, an image recognition rate of the camera 10 on the opposite side of the display device 1 can be reduced, and an image quality can be deteriorated. In addition, when a boundary line between the pixel units PXUs and the transmissive areas TAs is more complicated, a haze phenomenon in which an object is multiply displayed on a photographed image can more occur due to diffraction of light generated at the boundary line.

In order to solve this problem, hereinafter, a display device that is capable of increasing an image quality of a photographed image by increasing an area of the transmissive areas TA and disposing the unit pixels PXUs in a distributed manner is described.

Figure 3:
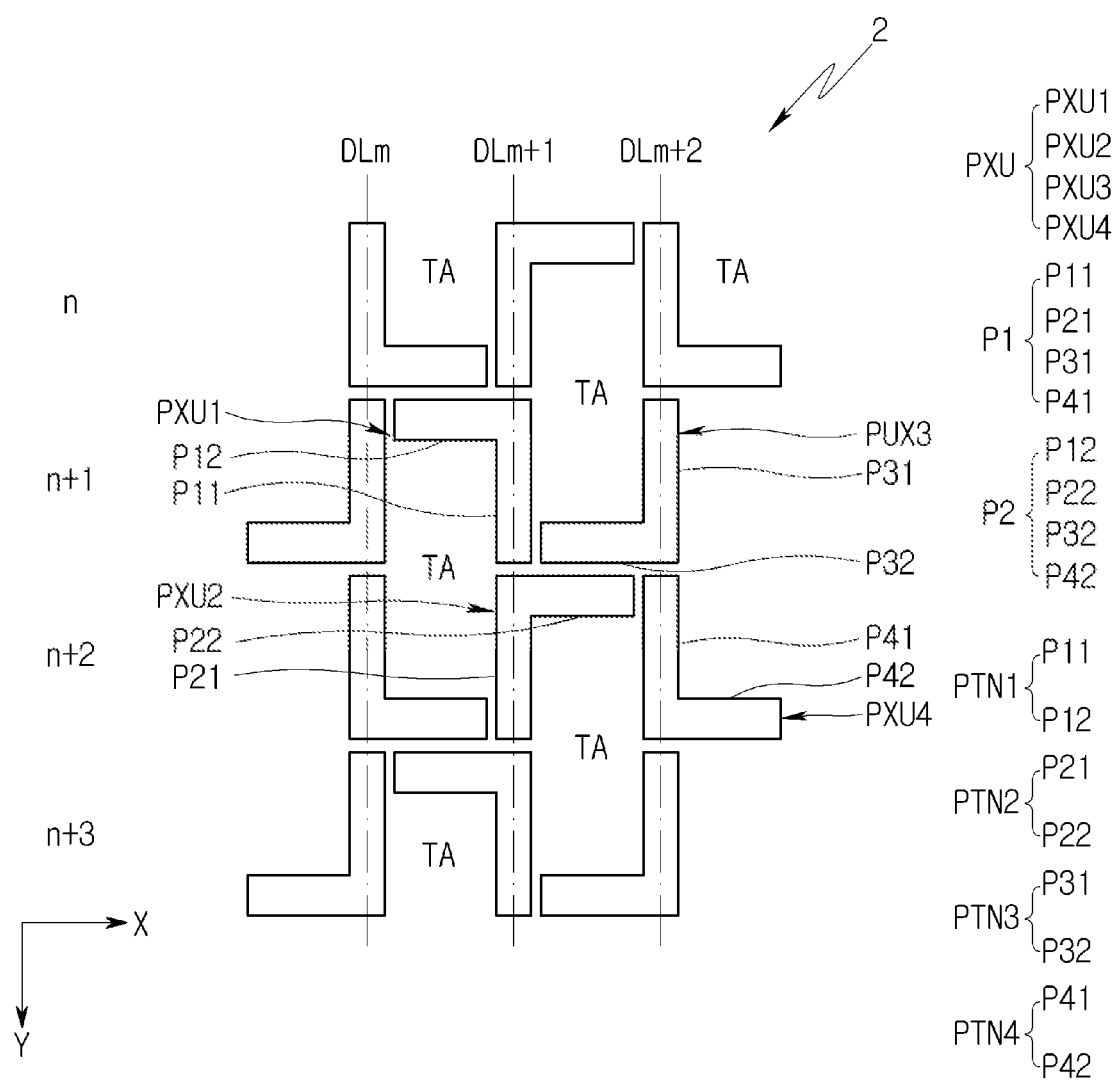
FIGS. 3 and 4 are plan views illustrating a display device according to a first aspect of the present disclosure.
Figure 4:
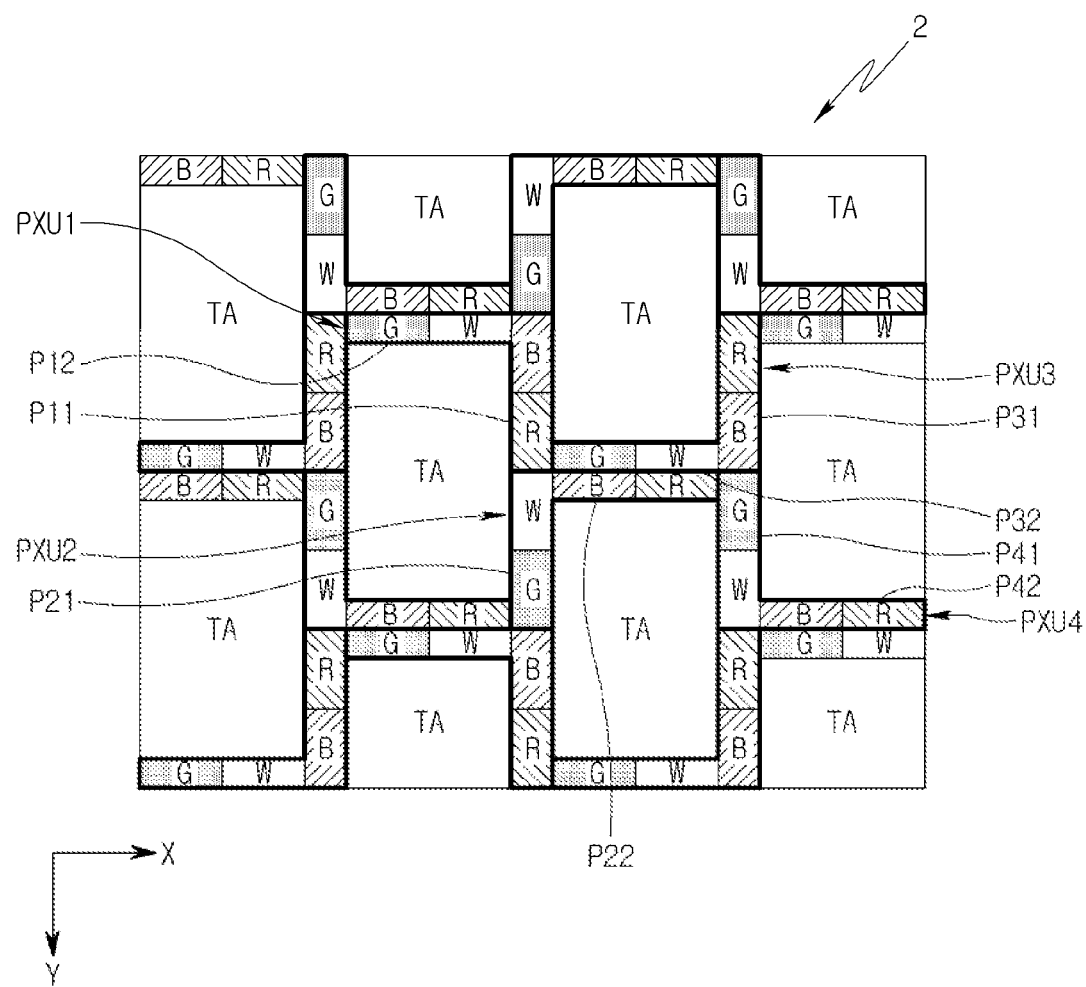

FIGS. 3 and 4 are plan views illustrating a display device according to a first aspect of the present disclosure.

Referring to FIG. 3, a display device 2 according to a first aspect of the present disclosure includes the unit pixels PXUs aligned along the row direction X and the column direction Y. In FIG. 3, the unit pixels PXUs disposed on nth to n+3th pixel rows, disposed on mth to m+2th pixel columns, and connected to mth to m+2th data lines DLm to DLm+2 are illustrated. An area on which the unit pixels PXUs are not disposed may be formed of the transmissive areas TA.

In this aspect, each unit pixel PXU may have a shape according to one of first to fourth patterns PTN1 to PTN4. Each pattern PTN1 to PTN4 may be formed of first extension parts P1 (P11, P21, P31, P41) extending in the column direction Y and second extension parts P2 (P12, P22, P32, P42) extending in the row direction X from a first end of the first extension parts P1 (P11, P21, P31, P41).

For example, the first pattern PTN1 may be formed of the first extension part P11 extending in the column direction Y and the second extension part P12 extending in a left direction along the row direction X from an upper end of the first extension part, and the first pattern PTN1 may have a "]" shape. The second pattern PTN2 may be formed of the first extension part P21 extending in the column direction Y and the second extension part P22 extending in a right direction along the row direction X from an upper end of the first extension part P21, and the second pattern PTN2 may have a "⌈" shape. The third pattern PTN3 may be formed of the first extension part P31 extending in the column direction Y and a second extension part P32 extending in the left direction along the row direction X from a lower end of the first extension part P31, and the third pattern PTN3 may have a "⌋" shape. The fourth pattern PTN4 may be formed of the first extension part P41 extending in the column direction Y and the second extension part P42 extending in the right direction along the row direction X from a lower end of the first extension part P41, and the fourth pattern PTN4 may have a "⌊" shape.

The unit pixels PXUs adjacent to each other in the row direction X and the column direction Y may have different patterns from each other. For example, the unit pixels PXUs in two patterns may be alternately disposed along the row direction X and the column direction Y. Particularly, in the unit pixels PXUs in the first aspect, the first extension parts P11, P21, P31, and P41 of each unit pixel PXU are arranged in a row along the column direction Y, and the second extension parts P12, P22, P32, and P42 of a pair of the unit pixels PXUs are arranged to extend in different directions from each other. In addition, the second extension parts P12, P22, P32, and P42 of each unit pixel PXU may be disposed in a zigzag manner along the row direction X.

In an aspect in FIG. 3, when the first unit pixel PXU1 has the first pattern PTN1, the second unit pixel PXU2 adjacent to the first unit pixel PXU1 in the column direction Y may have the second pattern PTN2, and the third unit pixel PXU3 adjacent to the first unit pixel PXU1 in the row direction X may have the third pattern PTN3. In addition, the fourth unit pixel PXU4 adjacent to the third unit pixel PXU3 in the column direction Y may have the fourth pattern PTN4.

In the aspect as described above, an area surrounded by four unit pixels PXUs that have different patterns from each other and disposed adjacent to each other in the row direction X and the column direction Y may form the transmissive areas TA. In the aspect in FIG. 3, an area surrounded by the first unit pixel PXU1, the first extension part P21 of the second unit pixel PXU2, the first extension part P31 of the third unit pixel PXU3, and the fourth unit pixel PXU4 may form the transmissive areas TA. In this aspect, the transmissive areas TA are disposed in a zigzag manner along the row direction X.

Compared with the aspect in FIG. 1, the transmissive areas TA of the display device 2 according to the first aspect has a larger size in the column direction Y. In this manner, when the area of the transmissive areas TA is increased, the camera system as illustrated in FIG. 2 can acquire an image of the user 30 in more areas through the camera system 10, so that the image recognition rate of the camera system can be improved. In addition, when the area of the transmissive areas TA is increased, the boundary line between the transmissive area TA and the unit pixel PXU becomes monotonous, so that the haze phenomenon of the image photographed through the camera 10 can be reduced.

Further referring to FIG. 4, each unit pixel PXU includes a plurality of sub-pixels R, G, B, and W. Each sub-pixel R, G, B, and W may display one of red, green, blue, and white colors. Four sub-pixels R, G, B, and W that display different colors from each other form one unit pixel PXU.

In the unit pixels PXUs, the sub-pixels R, G, B and W are distributedly disposed in an L type. For an example, a part (for example, two sub-pixels) of the four sub-pixels R, G, B, and W may be disposed on the first extension parts P11, P21, P31, and P41 of each unit pixel PXU, and the other part (for example, two sub-pixels) of the four sub-pixels R, G, B, and W may be disposed on the second extension parts P12, P22, P32, P42. In addition, the sub-pixels R, G, B, and W may be disposed differently depending on the patterns of the unit pixels PXUs.

For example, on the first pattern PTN1, a blue sub-pixel B and a red sub-pixel R may be sequentially disposed on the first extension part P11 along the column direction Y, and a green sub-pixel G and a white sub-pixel W may be sequentially disposed on the second extension part P12 along the row direction X. On the second pattern PTN2, the white sub-pixel W and the green sub-pixel G may be sequentially disposed on the first extension part P21 along the column direction Y, and the blue sub-pixel B and the red sub-pixel R may be sequentially disposed on the second extension part P22 along the row direction X. On the third pattern PTN3, the red sub-pixel R and the blue sub-pixel B may be sequentially disposed on the first extension part P31 along the column direction Y, and the green sub-pixel G and the white sub-pixel W may be sequentially disposed on the second extension part P32 along the row direction X. On the fourth pattern PTN4, the green sub-pixel G and the white sub-pixel W may be sequentially disposed on the first extension part P41 along the column direction Y, and the blue sub-pixel B and the red sub-pixel R may be sequentially disposed on the second extension part P42 along the row direction X.

When the sub-pixels R, G, B, and W are disposed on the patterns PTN1 to PTN4, the pixel units PXUs may be disposed so that the sub-pixels R, G, B, and W of the same color are not to be in contact with each other between the unit pixels PXUs adjacent to each other.

For example, on the first extension parts P11, P21, P31, and P41 that are disposed in a row along the column direction Y, the sub-pixels R, G, B, and W of different colors may be sequentially arranged. In addition, on the second extension parts P12, P22, P32, and P42 that are disposed adjacent to each other in the column direction Y, the sub-pixels R, G, B, and W of different colors may be arranged in the matrix form.

As described above, when the sub-pixels R, G, B, and W of the same colors are disposed at the furthest position between the adjacent unit pixels PXUs, a boundary of an image displayed by the display device 2 is smoothly displayed, so that a clarity of the image may be improved. In particular, by using the display device 2, a text readability of the displayed image may be improved. In addition, as the sub-pixels R, G, B, and W are distributedly disposed in the L type, the image recognition rate on the opposite side of the display device with respect to the camera in FIGS. 2A and 2B may be improved.

Figure 5:
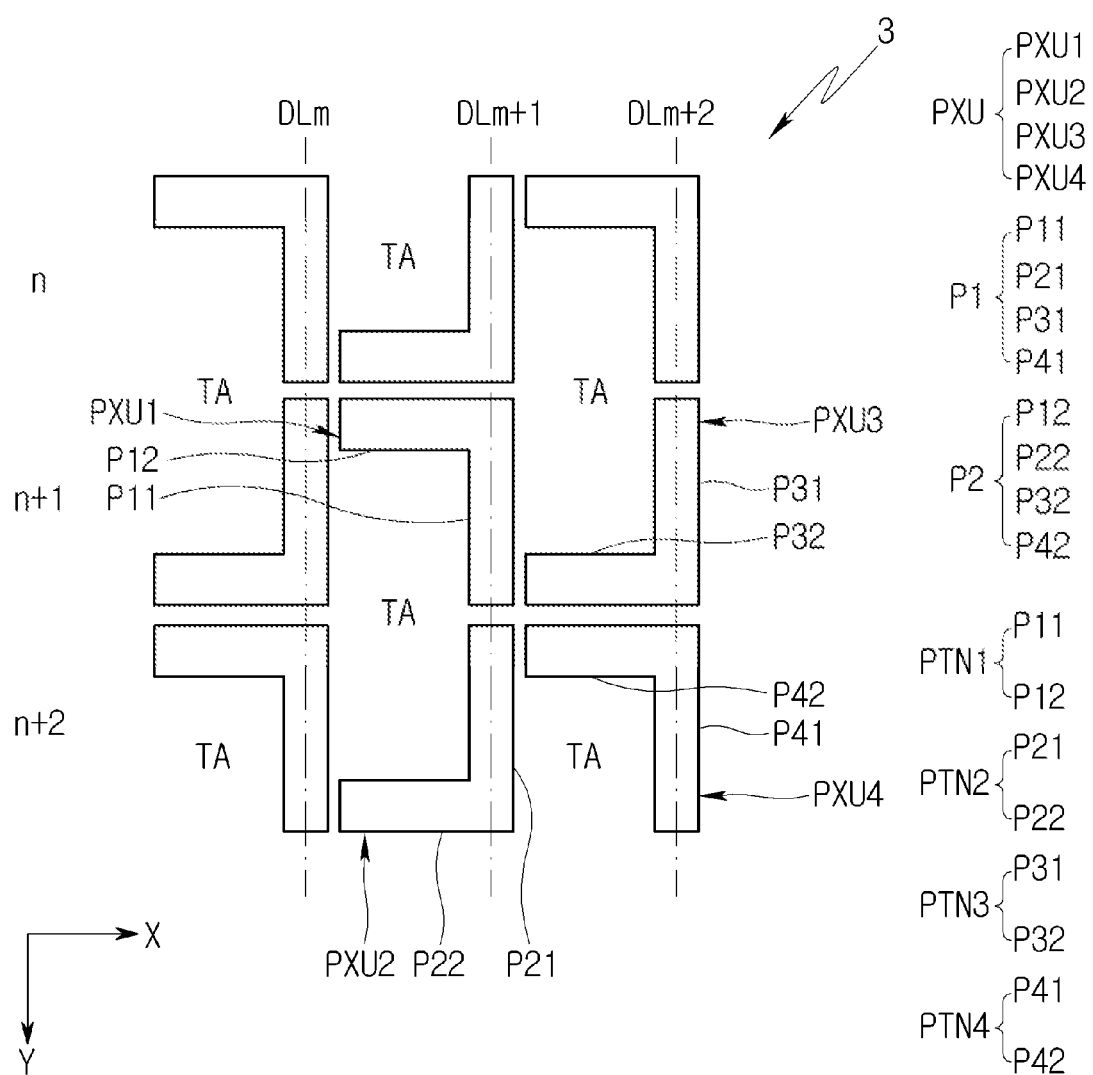
FIGS. 5 and 6 are plan views illustrating a display device according to a second aspect of the present disclosure.
Figure 6:
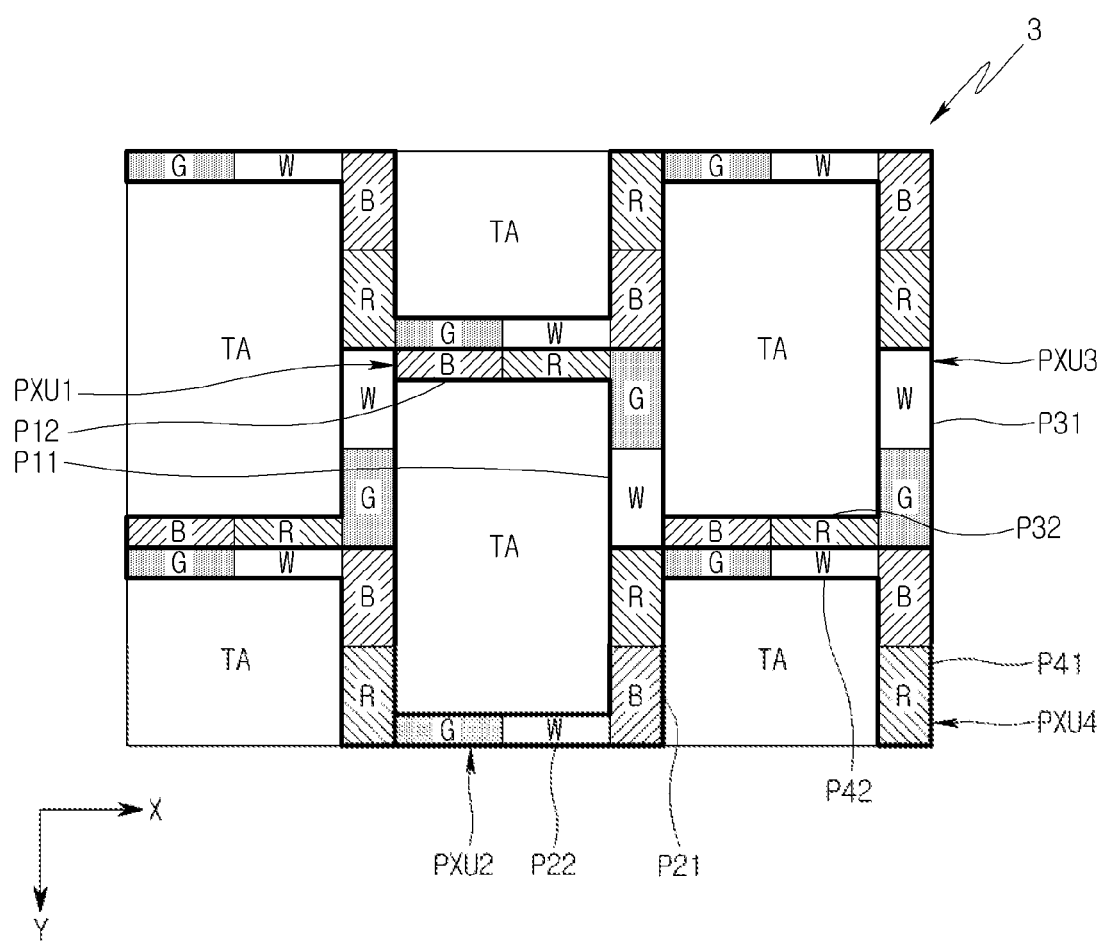

FIGS. 5 and 6 are plan views illustrating a display device according to a second aspect of the present disclosure.

Referring to FIG. 5, a display device 3 according to a second aspect of the present disclosure includes the unit pixels PXUs aligned along the row direction X and the column direction Y. In FIG. 5, the unit pixels PXUs disposed on nth to n+2th pixel rows, disposed on mth to m+2th pixel columns, and connected to mth to m+2th data lines DLm to DLm+2 are illustrated. An area on which the unit pixels PXUs are not disposed may be formed of the transmissive area TA.

In this aspect, each unit pixel PXU may have a shape according to one of the first to fourth patterns PTN1 to PTN4. Each pattern PTN1 to PTN4 may be formed of the first extension parts P1 (P11, P21, P31, P41) extending in the column direction Y and the second extension parts P2 (P12, P22, P32, P42) extending in the row direction X from the first end of the first extension parts P1 (P11, P21, P31, P41).

For example, the first pattern PTN1 may be formed of the first extension part P11 extending in the column direction Y and the second extension part P12 extending in the left direction along the row direction X from the upper end of the first extension part P11, and the first pattern PTN1 may have a "┐" shape. The second pattern PTN2 may be formed of the first extension part P21 extending in the column direction Y and the second extension part P22 extending in the left direction along the row direction X from the lower end of the first extension part P21, and the second pattern PTN2 may have a "┘" shape. The third pattern PTN3 has the same shape as the second pattern PTN2, and has the first extension part P31 and the second extension part P32. The fourth pattern PTN4 has the same shape as the first pattern PTN1, and has the first extension part P41 and the second extension part P42.

In FIG. 5, the second extension parts P12, P22, P32, and P42 extending in the left direction from the first extension parts P11, P21, P31, and P41 are illustrated as an aspect, but the aspect is not limited thereto. That is, in another aspect, the second extension parts P12, P22, P32, and P42 may extend in the right direction from the first extension parts P11, P21, P31, and P41.

The unit pixels PXUs adjacent to each other in the row direction X and the column direction Y may have different patterns from each other. For example, the unit pixels PXUs in two patterns may be alternately disposed along the row direction X and the column direction Y. In particular, in the unit pixels PXUs in the second aspect, the first extension parts P11, P21, P31, and P41 of each unit pixel PXU are arranged in a row along the column direction Y. Further, a pair of the unit pixels PXUs disposed adjacent to each other is arranged so that the second extension parts P12, P22, P32, and P42 thereof extend in the different directions from each other. In addition, the second extension parts P12, P22, P32, and P42 of each unit pixel PXU may be disposed in the zigzag manner along the row direction X.

In an aspect in FIG. 5, when the first unit pixel PXU1 has the first pattern PTN1, the second unit pixel PXU2 adjacent to the first unit pixel PXU1 in the column direction Y may have the second pattern PTN2, and the third unit pixel PXU3 adjacent to the first unit pixel PXU1 in the row direction X may have the third pattern PTN3. In addition, the fourth unit pixel PXU4 adjacent to the third unit pixel PXU3 in the column direction Y may have the fourth pattern PTN4.

In an aspect as described above, an area surrounded by four unit pixels PXUs that have different patterns from each other and disposed adjacent to each other in the row direction X and the column direction Y may form the transmissive area TA. In an aspect in FIG. 5, an area surrounded by the first unit pixel PXU1, the second unit pixel PXU2, the first extension part P31 of the third unit pixel PXU3, and the first extension part P41 of the fourth unit pixel PXU4 may form the transmissive area TA. In this aspect, the transmissive area TA is disposed in the zigzag manner along the row direction X.

Further referring to FIG. 6, each unit pixel PXU includes the plurality of sub-pixels R, G, B, and W. Each sub-pixel R, G, B, and W may display one of red, green, blue, and white colors. Four sub-pixels R, G, B, and W that display different colors from each other form one unit pixel PXU.

In the unit pixels PXUs, the sub-pixels R, G, B, and W are distributedly disposed in the L type. For an example, a part (for example, two sub-pixels) of the four sub-pixels R, G, B, and W may be disposed on the first extension parts P11, P21, P31, and P41 of each unit pixel PXU, and the other part (for example, two sub-pixels) of the four sub-pixels R, G, B, and W may be disposed on the second extension parts P12, P22, P32, P42 of each unit pixel PXU. In addition, the sub-pixels R, G, B, and W may be disposed differently depending on the patterns of the unit pixels PXUs.

For example, on the first pattern PTN1, the green sub-pixel G and the white sub-pixel W may be sequentially disposed on the first extension part P11 along the column direction Y, and the blue sub-pixel B and the red sub-pixel R may be sequentially disposed on the second extension part P12 along the row direction X. For example, on the second pattern PTN2, the red sub-pixel R and the blue sub-pixel B may be sequentially disposed on the first extension part P21 along the column direction Y, and the green sub-pixel G and the white sub-pixel W may be sequentially disposed on the second extension part P22 along the row direction X. On the third pattern PTN3, the white sub-pixel W and the green sub-pixel G may be sequentially disposed on the first extension part P31 along the column direction Y, and the blue sub-pixel B and the red sub-pixel R may be sequentially disposed on the second extension part P32 along the row direction X. On the fourth pattern PTN4, the blue sub-pixel B and the red sub-pixel R may be sequentially disposed on the first extension part P41 along the column direction Y, and the green sub-pixel G and the white sub-pixel W may be sequentially disposed on the second extension part P42 along the row direction X.

When the sub-pixels R, G, B, and W are disposed on the patterns PTN1 to PTN4, the pixel units PXUs may disposed so that the sub-pixels R, G, B, and W of the same color are not to be in contact with each other between the unit pixels PXUs adjacent to each other.

For example, on the first extension parts P11, P21, P31, and P41 that are disposed in a row along the column direction Y, the sub-pixels R, G, B, and W of different colors may be sequentially arranged. In addition, on the second extension parts P12, P22, P32, and P42 that are disposed adjacent to each other in the column direction Y, the sub-pixels R, G, B, and W of different colors may be arranged in the matrix form.

Figure 7:
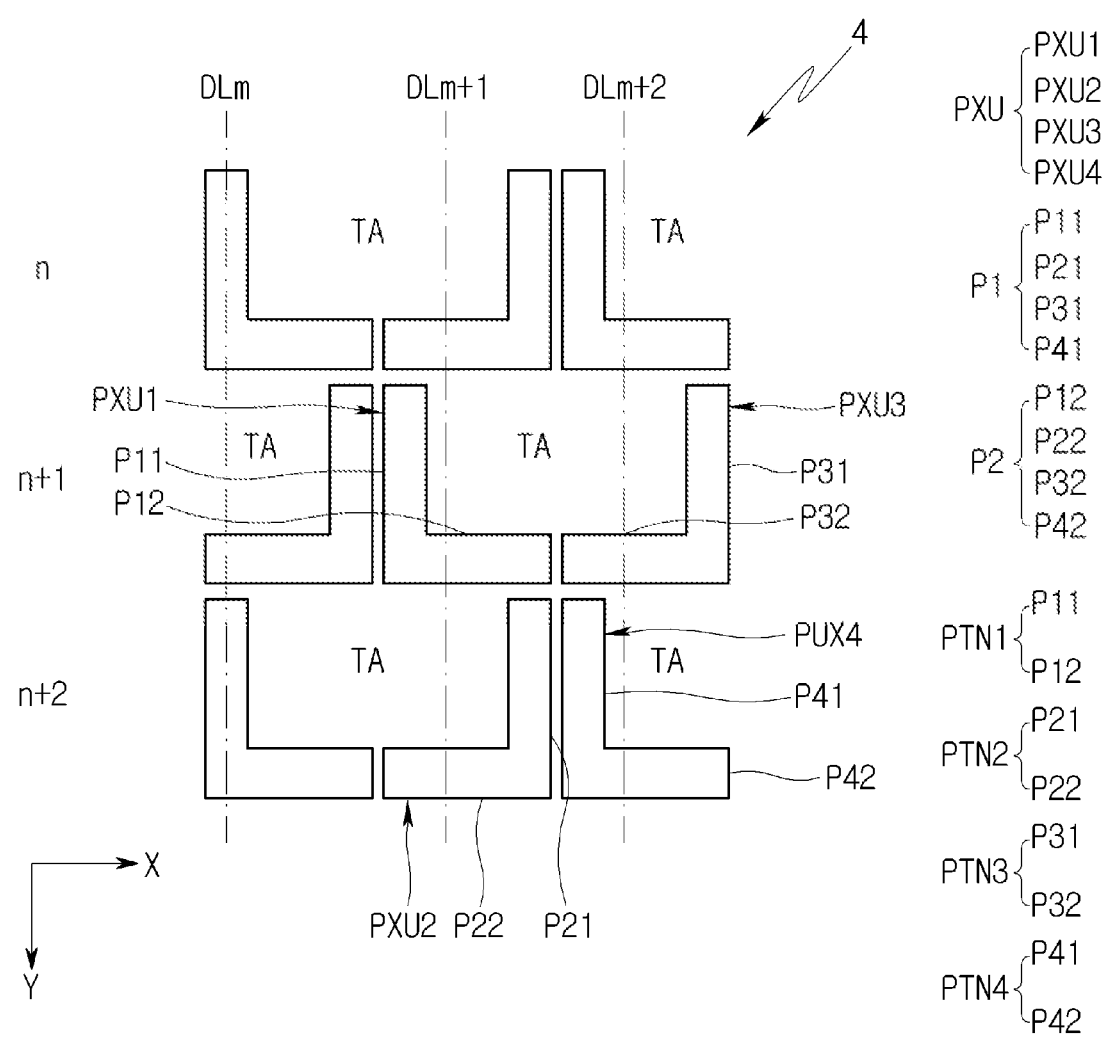
FIGS. 7 and 8 are plan views illustrating a display device according to a third aspect of the present disclosure.
Figure 8:
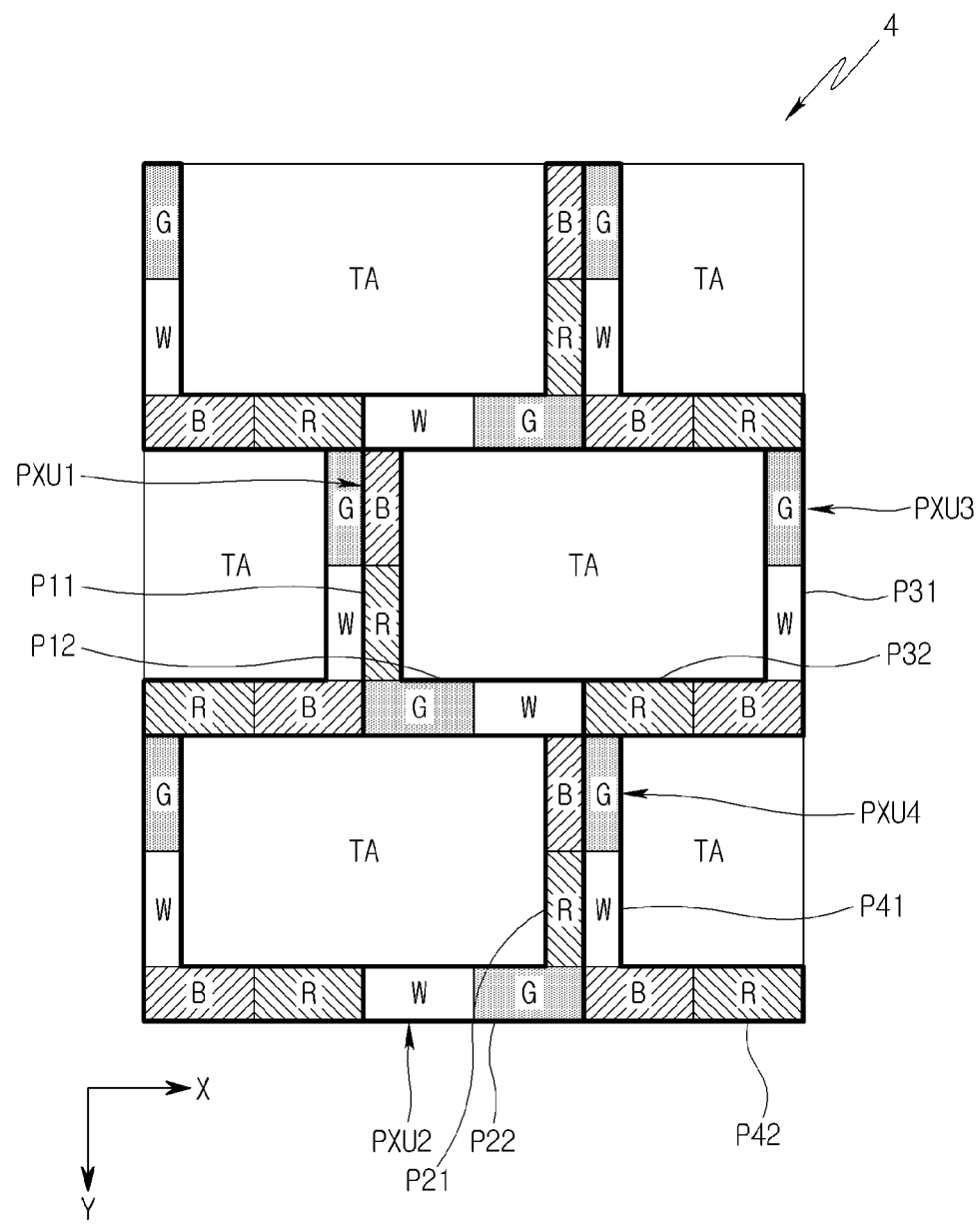

FIGS. 7 and 8 are plan views illustrating a display device according to a third aspect of the present disclosure.

Referring to FIG. 7, a display device 4 according to a third aspect of the present disclosure includes the unit pixels PXUs aligned along the row direction X and the column direction Y. In FIG. 7, the unit pixels PXUs disposed on nth to n+2th pixel rows, disposed on mth to m+2th pixel columns, and connected to mth to m+2th data lines DLm to DLm+2 are illustrated. An area on which the unit pixels PXUs are not disposed may be formed of the transmissive area TA.

In this aspect, each unit pixel PXU may have a shape according to any one of the first to the fourth patterns PTN1 to PTN4. Each pattern PTN1 to PTN4 may be formed of the first extension parts P1 (P11, P21, P31, P41) extending in the column direction Y and the second extension parts P2 (P12, P22, P32, P42) extending in the row direction X from the first end of the first extension parts P1 (P11, P21, P31, P41).

For example, the first pattern PTN1 may be formed of the first extension part P11 extending in the column direction Y and the second extension part P12 extending in the right direction along the row direction X from the lower end of the first extension part P11, and the first pattern PTN1 may have a "⌊" shape. The second pattern PTN2 may be formed of the first extension part P21 extending in the column direction Y and the second extension part P22 extending in the left direction along the row direction X from the lower end of the first extension part P21, and the second pattern PTN2 may have a "⌋" shape. The third pattern PTN3 has the same shape as the second pattern PTN2, and has the first extension part P31 and the second extension part P32. The fourth pattern PTN4 has the same shape as the first pattern PTN1, and has the first extension part P41 and the second extension part P42.

The unit pixels PXUs adjacent to each other in the row direction X and the column direction Y may have different patterns from each other. For example, the unit pixels PXUs in two patterns may be alternately disposed along the row direction X and the column direction Y. In particular, in the third aspect, the unit pixels PXUs are arranged so that the second extension parts P12, P22, P32, and P42 of each unit pixel PXU are disposed in a row along the row direction X. In addition, the first extension parts P11, P21, P31, and P41 of each unit pixel PXU are disposed in the zigzag manner along the column direction Y, and a pair of the unit pixels PXUs disposed adjacent to each other is arranged so that the second extension parts P12, P22, P32, and P42 thereof extend in the different directions from each other.

In an aspect in FIG. 7, when the first unit pixel PXU1 has the first pattern PTN1, the second unit pixel PXU2 adjacent to the first unit pixel PXU1 in the column direction Y may have the second pattern PTN2, and the third unit pixel PXU3 adjacent to the first unit pixel PXU1 in the row direction X may have the third pattern PTN3. In addition, the fourth unit pixel PXU4 adjacent to the third unit pixel PXU3 in the column direction Y may have the fourth pattern PTN4.

In an aspect as described above, an area surrounded by four unit pixels PXUs that have different patterns from each other and disposed adjacent to each other in the row direction X and the column direction Y may form the transmissive area TA. In an aspect in FIG. 7, an area surrounded by the first unit pixel PXU1, the second extension part P22 of the second unit pixel PXU2, the third unit pixel PXU3, and the second extension part P42 of the fourth unit pixel PXU4 may form the transmissive area TA. In this aspect, the transmissive area TA is disposed in the zigzag manner along the column direction Y.

Compared with the aspect in FIG. 1, the transmissive area TA of the display device 4 according to the third aspect has a larger size in the row direction X. In this manner, when the area of the transmissive area TA is increased, the camera system as illustrated in FIG. 2 may acquire an image of the user 30 in more areas through the camera 10, so that the image recognition rate of the camera system may be improved. In addition, when the area of the transmissive area TA is increased, the boundary line between the transmissive area TA and the unit pixel PXU becomes monotonous, so that the haze phenomenon of the image photographed through the camera 10 may be reduced.

Further referring to FIG. 8, each unit pixel PXU includes the plurality of sub-pixels R, G, B, and W. Each sub-pixel R, G, B, and W may display any one of red, green, blue, and white colors. Four sub-pixels R, G, B, and W that display different colors from each other form one unit pixel PXU.

In the unit pixels PXUs, the sub-pixels R, G, B, and W are distributedly disposed in the L type. For an example, a part (for example, two sub-pixels) of the four sub-pixels R, G, B, and W may be disposed on the first extension parts P11, P21, P31, and P41 of each unit pixel PXU, and the other part (for example, two sub-pixels) of the four sub-pixels R, G, B, and W may be disposed on the second extension parts P12, P22, P32, P42 of each unit pixel PXU. In addition, the sub-pixels R, G, B, and W may be disposed differently depending on the patterns of the unit pixels PXUs.

For example, on the first pattern PTN1, the blue sub-pixel B and the red sub-pixel R may be sequentially disposed on the first extension part P11 along the column direction Y, and the green sub-pixel G and the white sub-pixel W may be sequentially disposed on the second extension part P12 along the row direction X. On the second pattern PTN2, the blue sub-pixel B and the red sub-pixel R may be sequentially disposed on the first extension part P21 along the column direction Y, and the white sub-pixel W and the green sub-pixel G may be sequentially disposed on the second extension part P22 along the row direction X. On the third pattern PTN3, the green sub-pixel G and the white sub-pixel W may be sequentially disposed on the first extension part P31 along the column direction Y, and the red sub-pixel R and the blue sub-pixel B may be sequentially disposed on the second extension part P32 along the row direction X. On the fourth pattern PTN4, the green sub-pixel G and the white sub-pixel W may be sequentially disposed on the first extension part P41 along the column direction Y, and the blue sub-pixel B and the red sub-pixel R may be sequentially disposed on the second extension part P42 along the row direction X.

When the sub-pixels R, G, B, and W are disposed on the patterns PTN1 to PTN4, the pixel units PXUs may disposed so that the sub-pixels R, G, B, and W of the same color are not to be in contact with each other between the adjacent pixel units PXUs.

For example, on the second extension parts P12, P22, P32, and P42 that are disposed in a row along the row direction X, the sub-pixels R, G, B, and W of different colors may be sequentially arranged. In addition, on the first extension parts P11, P21, P31, and P41 that are disposed adjacent to each other in the row direction X, the sub-pixels R, G, B, and W of different colors may be arranged in the matrix form.

Figure 9:
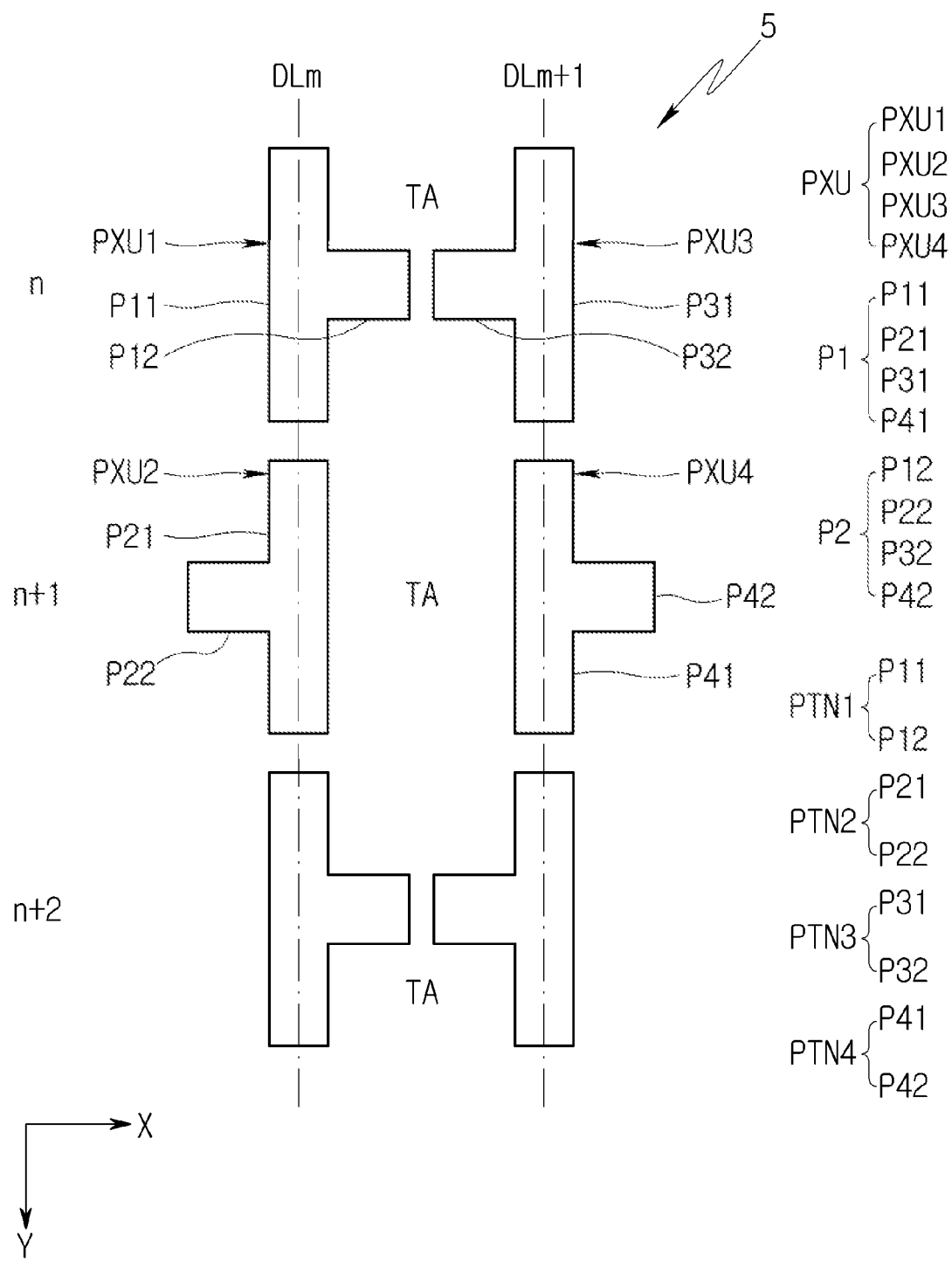
FIGS. 9 and 10 are plan views illustrating a display device according to a fourth aspect of the present disclosure.
Figure 10:
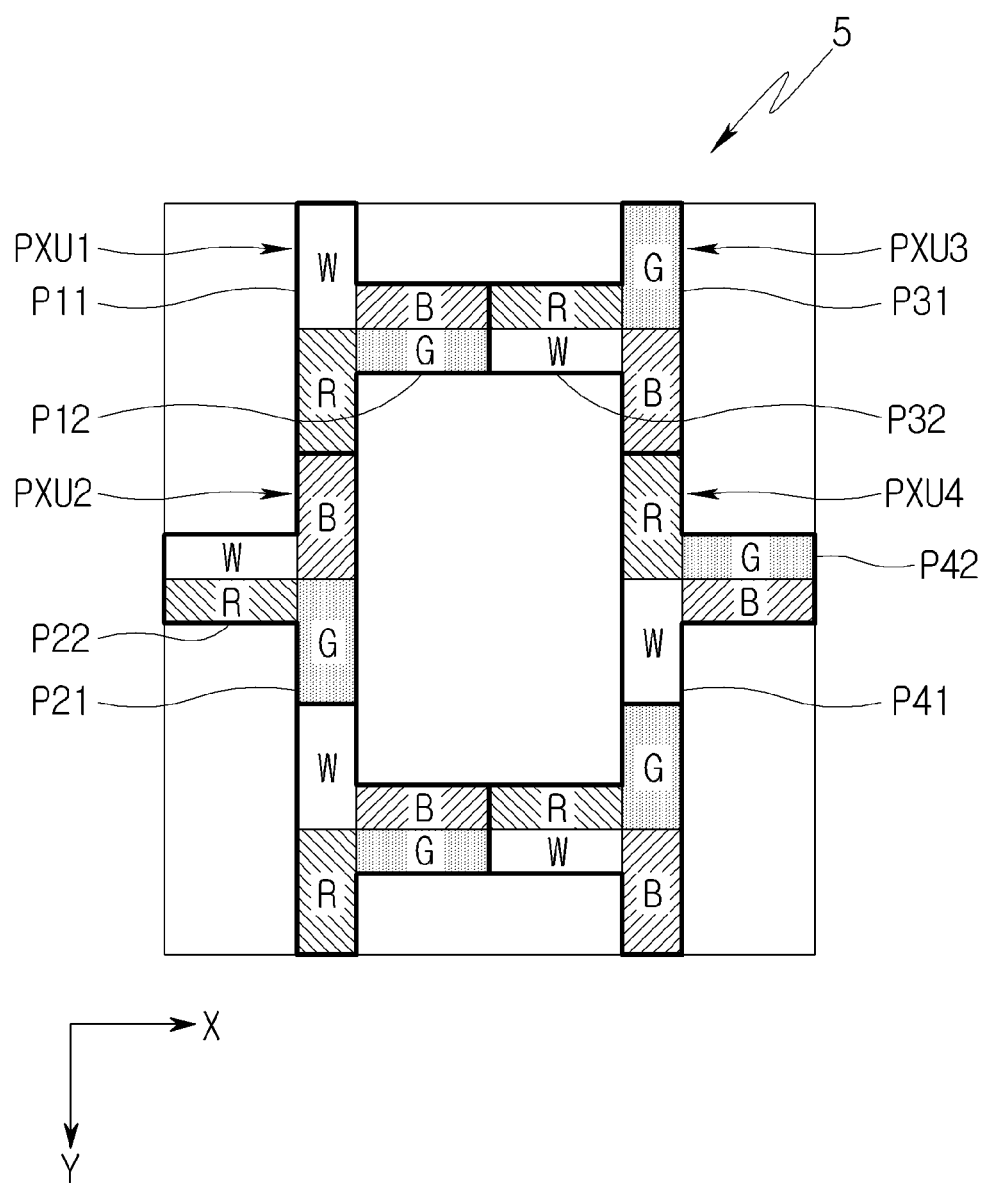

FIGS. 9 and 10 are plan views illustrating a display device according to a fourth aspect of the present disclosure.

Referring to FIG. 9, a display device 5 according to a fourth aspect of the present disclosure includes the unit pixels PXUs aligned along the row direction X and the column direction Y. In FIG. 9, the unit pixels PXUs disposed on nth to n+2th pixel rows, disposed on mth to m+1th pixel columns, and connected to mth to m+1th data lines DLm to DLm+1 are illustrated. An area on which the unit pixels PXUs are not disposed may be formed of the transmissive area TA.

In this aspect, each unit pixel PXU may have a shape according to any one of the first to the fourth patterns PTN1 to PTN4. Each pattern PTN1 to PTN4 may be formed of the first extension parts P1 (P11, P21, P31, P41) extending in the column direction Y and the second extension parts P2 (P12, P22, P32, P42) extending in the row direction X from the first end of the first extension parts P1 (P11, P21, P31, P41).

For example, the first pattern PTN1 may be formed of the first extension part P11 extending in the column direction Y and the second extension part P12 extending in the right direction along the row direction X from a first side of the first extension part P11, and the first pattern PTN1 may have a "⌐" shape. The second pattern PTN2 may be formed of the first extension part P21 extending in the column direction Y and the second extension part P22 extending in the left direction along the row direction X from a second side of the first extension part P21, and the second pattern PTN2 may have a "⌐" shape. The third pattern PTN3 has the same shape as the second pattern PTN2, and has the first extension part P31 and the second extension part P32. The fourth pattern PTN4 has the same shape as the first pattern PTN1, and has the first extension part P41 and the second extension part P42.

The unit pixels PXUs adjacent to each other in the row direction X and the column direction Y may have different patterns from each other. For example, the unit pixels PXUs in two patterns may be alternately disposed along the row direction X and the column direction Y. In particular, in the unit pixels PXUs in the fourth aspect, the first extension parts P11, P21, P31, and P41 of each unit pixel PXU are arranged in a row along the column direction Y. Further, a pair of unit pixels PXUs disposed adjacent to each other along the column direction Y are arranged so that the second extension parts P12, P22, P32, and P42 thereof extend in the different directions from each other. In addition, the second extension parts P12, P22, P32, and P42 of each unit pixel PXU may be disposed in a zigzag manner along the row direction X.

In an aspect in FIG. 9, when the first unit pixel PXU1 has the first pattern PTN1, the second unit pixel PXU2 adjacent to the first unit pixel PXU1 in the column direction Y may have the second pattern PTN2, and the third unit pixel PXU3 adjacent to the first unit pixel PXU1 in the row direction X may have the third pattern PTN3. In addition, the fourth unit pixel PXU4 adjacent to the third unit pixel PXU3 in the column direction Y may have the fourth pattern PTN4.

In an aspect as described above, an area surrounded by six unit pixels PXUs that have different patterns from each other and disposed adjacent to each other in the row direction X and the column direction Y may form the transmissive area TA. In this aspect, the transmissive area TA is disposed in a zigzag manner along the row direction X.

Further referring to FIG. 10, each unit pixel PXU includes the plurality of sub-pixels R, G, B, and W. Each sub-pixel R, G, B, and W may display any one of red, green, blue, and white colors. Four sub-pixels R, G, B, and W that display different colors from each other form one unit pixel PXU.

In the unit pixels PXUs, the sub-pixels R, G, B, and W are distributedly disposed in a T type. For an example, a part (for example, two sub-pixels) of the four sub-pixels R, G, B, and W may be disposed on the first extension parts P11, P21, P31, and P41 of each unit pixel PXU, and the other part (for example, two sub-pixels) of the four sub-pixels R, G, B, and W may be disposed on the second extension parts P12, P22, P32, P42 of each unit pixel PXU. In addition, the sub-pixels R, G, B, and W may be disposed differently depending on the patterns of the unit pixels PXUs.

For example, on the first pattern PTN1, the white sub-pixel W and the red sub-pixel R may be sequentially disposed on the first extension part P11 along the column direction Y, and the blue sub-pixel B and the green sub-pixel G may be sequentially disposed on the second extension part P12 along the column direction Y. On the second pattern PTN2, the blue sub-pixel B and the green sub-pixel G may be sequentially disposed on the first extension part P21 along the column direction Y, and the white sub-pixel W and the red sub-pixel R may be sequentially disposed on the second extension part P22 along the column direction Y. On the third pattern PTN3, the green sub-pixel G and the blue sub-pixel B may be sequentially disposed on the first extension part P31 along the column direction Y, and the red sub-pixel R and the white sub-pixel W may be sequentially disposed on the second extension part P32 along the column direction Y. On the fourth pattern PTN4, the red sub-pixel R and the white sub-pixel W may be sequentially disposed on the first extension part P41 along the column direction Y, and the green sub-pixel G and the blue sub-pixel B may be sequentially disposed on the second extension part P42 along the column direction Y.

When the sub-pixels R, G, B, and W are disposed on the patterns PTN1 to PTN4, the pixel units PXUs may be disposed so that the sub-pixels R, G, B, and W of the same color are not to be in contact with each other between the adjacent pixel units PXUs.

For example, on the first extension parts P11, P21, P31, and P41 that are disposed in a row along the column direction Y, the sub-pixels R, G, B, and W of different colors may be sequentially arranged. In addition, on the second extension parts P12, P22, P32, and P42 that are disposed adjacent to each other in the row direction X, the sub-pixels R, G, B, and W of different colors may be arranged in the matrix form.

The aspects of the present disclosure have been described above with reference to the accompanying drawings, but it will be understood that the technical configuration of the present disclosure described above may be practiced in other specific forms without changing the technical spirit or essential features of the present disclosure by those skilled in the art to which the present disclosure pertains. Therefore, the aspects described above are to be understood in all respects as illustrative and not restrictive. In addition, the scope of the present disclosure is indicated by the claims below, rather than the detailed description. In addition, all modifications or variations derived from the meaning and scope of the claims and their equivalent concepts should be construed as being included in the scope of the present disclosure.

What is claimed is:

1. A display device comprising:
   unit pixels arranged in a row direction and a column direction, and each of which comprises a plurality of sub-pixels; and
   transmissive areas disposed adjacent to the unit pixels and through which external light passes,
   wherein each of the unit pixels has a shape according to one of first, second and third and fourth patterns, and the unit pixels adjacent to each other in the row direction and the column direction have different patterns from each other,
   wherein the transmissive areas comprise a first transmissive area in a first column, a second transmissive area and a third transmissive area in a second column adjacent to the first column, the first transmissive area overlaps the second and third transmissive areas in the row direction,
   a first unit pixel of the unit pixels comprises a first sub-pixel, a second sub-pixel, a third sub-pixel, and fourth sub-pixel adjacent to each other,
   one side of the first sub-pixel is in contact with the second transmissive area, one side of the second sub-pixel is in contact with the second transmissive area, the other side opposite to one side of the second sub-pixel is in contact with the first transmissive area, one side of the third sub- pixel is in contact with the third transmissive area, the other side opposite to one side of the third sub-pixel is in contact with the first transmissive area, and one side of the fourth sub-pixel is in contact with the third transmissive area,
   when a first unit pixel has the first pattern, a second unit pixel disposed adjacent to the first unit pixel in the column direction has the second pattern, and a third unit pixel disposed adjacent to the first unit pixel in the row direction has the third pattern, and a fourth unit pixel disposed adjacent to the third unit pixel in the column direction has the fourth pattern.

2. The display device of claim 1, wherein the plurality of sub-pixels comprise a red color sub-pixel, a green color sub-pixel, a blue color sub-pixel, and a white color sub-pixel.

3. The display device of claim 2, further comprising a camera system disposed on a rear surface of a display panel having the unit pixels and the transmissive areas.

4. The display device of claim 3, wherein the camera system overlaps with the transmissive areas and at least one light-emitting portion among light-emitting portions of the sub-pixels.

5. The display device of claim 1, wherein each of the first to fourth patterns comprises:
   a first extension part extending in the column direction; and
   a second extension part extending in the row direction from a first end or a first side of the first extension part.

6. The display device of claim 5, wherein the unit pixels in two patterns among the first to the fourth patterns are alternately disposed along the row direction and the column direction.

7. The display device of claim 1, wherein the sub-pixels are disposed in the first to fourth patterns, and the sub-pixels of a same color are not in contact with each other between the unit pixels adjacent in the row direction and the column direction.

8. The display device of claim 7, wherein the first pattern comprises a first extension part and a second extension part extending from an upper end of the first extension part to a first side along the row direction,
   the second pattern comprises a first extension part and a second extension part extending from an upper end of the first extension part to a second side along the row direction,
   the third pattern comprises a first extension part and a second extension part extending from a lower end of the first extension part to the first side, and
   the fourth pattern comprises a first extension part and a second extension part extending from a lower end of the first extension part to the second side.

9. The display device of claim 8, wherein, in the unit pixels the first extension parts of the unit pixels are disposed in a row along the column direction,
   the second extension parts of a pair of the unit pixels disposed adjacent to each other in the column direction are extended in different side directions from each other, and
   the second extension parts of the unit pixels are disposed in a zigzag manner along the row direction.

10. The display device of claim 9, wherein sub-pixels of the unit pixels having different colors from each other are sequentially arranged on the first extension parts that are disposed in a row along the column direction, and sub-pixels having different colors from each other are arranged in a matrix form on the second extension parts that are disposed adjacent to each other in the column direction.

11. The display device of claim 9, wherein the transmissive areas are surrounded by four unit pixels having different patterns from each other and disposed adjacent to each other in the row direction and the column direction.

12. The display device of claim 11, wherein the transmissive areas are arranged in the zigzag manner along the row direction.

13. The display device of claim 7, wherein each of the first pattern and the fourth pattern comprises a first extension part and a second extension part extended from an upper end of the first extension part to a first side along the row direction, and each of the second pattern and the third pattern comprises a first extension part and a second extension part extended from a lower end of the first extension part to the first side along the row direction.

14. The display device of claim 13, wherein, in the unit pixels, the first extension parts of the unit pixels are disposed in a row along the column direction, and the second extension parts of a pair of the unit pixels disposed adjacent to each other in the column direction are disposed to extend in the same side directions from each other.

15. The display device of claim 7, wherein each of the first pattern and the fourth pattern comprises a first extension part and a second extension part extended from a lower end of the first extension part to a first side along the row direction, and each of the second pattern and the third pattern comprises a first extension part and a second extension part extended from a lower end of the first extension part to a second side along the row direction.

16. The display device of claim 15, wherein, in the unit pixels, the second extension parts of the unit pixels are disposed in a row along the row direction, the first extension parts of the unit pixels are disposed in a zigzag manner along the column direction, and the second extension parts of a pair of the unit pixels disposed adjacent to each other in the column direction are disposed to extend in different side directions from each other.

17. The display device of claim 16, wherein sub-pixels of the unit pixels having different colors from each other are sequentially arranged on the second extension parts that are disposed in a row along the row direction, and sub-pixels having different colors from each other are arranged in a matrix form on the first extension parts that are disposed adjacent to each other in the row direction.

18. The display device of claim 16, wherein the transmissive areas are arranged in the zigzag manner along the column direction.

19. The display device of claim 7, wherein each of the first pattern and the fourth pattern comprises a first extension part and a second extension part extended from a first side surface of the first extension part to a first side along the row direction, and each of the second pattern and the third pattern comprises a first extension part and a second extension part extended from a second side surface of the first extension part to a second side along the row direction.

20. The display device of claim 19, wherein, in the unit pixels, the first extension parts of the unit pixels are disposed in a row along the column direction, the second extension parts of the unit pixels are disposed in a row along the row direction, and the second extension parts of a pair of the unit pixels disposed adjacent to each other in the column direction are disposed to extend in different side directions from each other.

21. The display device of claim 20, wherein the transmissive areas are surrounded by six unit pixels disposed adjacent to each other in the row direction and the column direction.

22. A display device comprising:
a display panel;
a plurality of unit pixels disposed on the display panel and arranged in a row direction and a column direction, and each pixel including a plurality of sub-pixels that has one of first, second and third and fourth patterns extended along the row and column directions; and
a plurality of light transmissive areas defined by at least one unit pixel alternately disposed along each of the row and column directions, and
wherein two adjacent unit pixels along the row and column directions have different patterns from each other, and
wherein the plurality of light transmissive areas completely overlaps with one another in only one of the row and column directions,
wherein the plurality of light transmissive areas comprise a first transmissive area in a first column, a second transmissive area and a third transmissive area in a second column adjacent to the first column, the first transmissive area overlaps the second and third transmissive areas in the row direction,
a first unit pixel of the unit pixels comprises a first sub-pixel, a second sub-pixel, a third sub-pixel, and fourth sub-pixel adjacent to each other,
one side of the first sub-pixel is in contact with the second transmissive area, one side of the second sub-pixel is in contact with the second transmissive area, the other side opposite to one side of the second sub-pixel is in contact with the first transmissive area, one side of the third sub-pixel is in contact with the third transmissive area, the other side opposite to one side of the third sub-pixel is in contact with the first transmissive area, and one side of the fourth sub-pixel is in contact with the third transmissive area,
when a first unit pixel has the first pattern, a second unit pixel disposed adjacent to the first unit pixel in the column direction has the second pattern, and a third unit pixel disposed adjacent to the first unit pixel in the row direction has the third pattern, and a fourth unit pixel disposed adjacent to the third unit pixel in the column direction has the fourth pattern.

23. The display device of claim 22, further comprising a camera system disposed on a opposite side of the display panel where the unit pixels and the plurality of light transmissive areas are located.

24. The display device of claim 23, wherein the camera system overlaps with the plurality of light transmissive areas and at least one light-emitting portion of the plurality of sub-pixels.

* * * * *